（12）United States Patent
Rasool et al.

(10) Patent No.: US 12,353,126 B2
(45) Date of Patent: Jul. 8, 2025

(54) METHOD AND DEVICE FOR QUALIFYING A MASK OF A LITHOGRAPHY SYSTEM

(71) Applicant: Carl Zeiss SMT GmbH, Oberkochen (DE)

(72) Inventors: Asad Rasool, Jena (DE); Carola Blaesing-Bangert, Kassel (DE); Steffen Weissenberg, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 154 days.

(21) Appl. No.: 18/373,351

(22) Filed: Sep. 27, 2023

(65) Prior Publication Data

US 2024/0103360 A1    Mar. 28, 2024

(30) Foreign Application Priority Data

Sep. 27, 2022   (DE) .......................... 102022124800.3

(51) Int. Cl.
   *G03F 1/84* (2012.01)
   *G03F 1/72* (2012.01)
   *G03F 7/00* (2006.01)

(52) U.S. Cl.
   CPC ................. *G03F 1/84* (2013.01); *G03F 1/72* (2013.01); *G03F 7/70625* (2013.01); *G03F 7/70633* (2013.01)

(58) Field of Classification Search
   CPC .......... G03F 1/84; G03F 1/72; G03F 7/70625; G03F 7/70633
   See application file for complete search history.

(56) References Cited

U.S. PATENT DOCUMENTS

| | | | |
|---|---|---|---|
| 9,134,112 B2* | 9/2015 | Sharoni | G03F 7/70625 |
| 10,157,804 B2* | 12/2018 | Pforr | H01L 22/24 |
| 2005/0190381 A1 | 9/2005 | Mui et al. | |
| 2006/0228865 A1* | 10/2006 | Lin | G03F 7/70533 |
| | | | 438/401 |
| 2013/0044205 A1 | 2/2013 | Matsumoto et al. | |

FOREIGN PATENT DOCUMENTS

JP    2013-40873    2/2013

* cited by examiner

*Primary Examiner* — Hung V Nguyen
(74) *Attorney, Agent, or Firm* — Fish & Richardson P.C.

(57) ABSTRACT

A method for qualifying a mask for a lithography system, the mask having measurement points for detecting critical dimensions of the mask, comprising: first detection of critical dimensions of the mask at the measurement points, the first detection taking place sequentially and the duration of the first detection defining a measurement time period; determining reference measurement points from the measurement points, the number of reference measurement points being less than the number of measurement points; second detection of the at least one critical dimension of the mask at the reference measurement points; determining a deviation between the first and the second detected critical dimension at each of the reference measurement points; and applying a determined temporal profile of the correction factor to the at least one critical dimension to obtain a corrected critical dimension of the mask, and also a corresponding device for qualifying a mask for a lithography system.

20 Claims, 6 Drawing Sheets

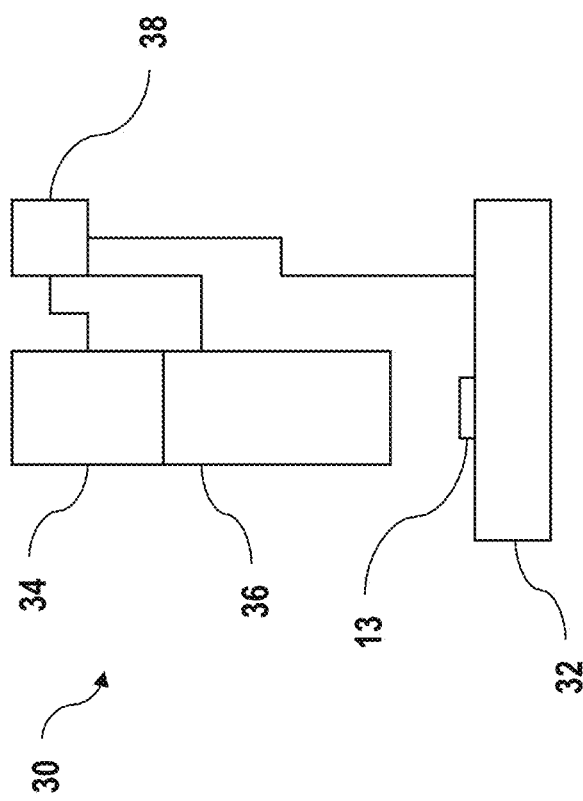

METHOD AND DEVICE FOR QUALIFYING A MASK OF A LITHOGRAPHY SYSTEM

CROSS-REFERENCE TO RELATED APPLICATION

The present application claims the priority of the German patent application 10 2022 124 800.3, filed on Sep. 27, 2022, the entire content of which is herein incorporated by reference.

TECHNICAL FIELD

The present invention relates to a method and also a device for qualifying a mask of a lithography system.

BACKGROUND

Microlithographic lithography systems are used in the production of microstructured components, such as integrated circuits, for example, having particularly small structures. In a lithography system, the image of a mask (also called "reticle") illuminated with deep ultraviolet or extreme ultraviolet radiation (DUV or EUV radiation) having a very short wavelength by use of an illumination device is imaged onto a lithography object by use of a projection device in order to transfer the mask structure to the lithography object.

In order to achieve a high imaging quality, the mask structure must already have a high accuracy. In order to ensure that a mask satisfies these accuracy requirements and a lithography object produced thereby also has the desired properties and functioning, a mask is checked for deviations from the actually desired structure prior to use in a lithography system by way of qualification methods. In order that the qualification has the highest possible precision, it is necessary to test the mask structure, for example by use of interferometric methods, at the largest possible number of measurement points. Furthermore, the mask structure is tested a number of times in succession in order to be able to determine deviations between the results ascertained in the measurement passes and thus to be able to take account of any influencing of the testing by the device used therefor, for example owing to a drift that occurs during the testing (for example a temperature drift or a damper drift), by use of a suitable correction. Such a qualification method is thus associated with a considerable time expenditure.

SUMMARY

It is therefore an aspect of the present invention, against the background of the problems mentioned above, to provide an improved method and an improved device which enable a qualification of a mask of a lithography system that is as precise as possible to be performed with less time expenditure.

The solution according to the invention resides in the features of the independent claims. The dependent claims relate to advantageous developments.

The invention discloses a method for qualifying a mask for a lithography system, wherein the mask has a plurality of predefined measurement points for detecting one or more critical dimensions of the mask at each measurement point, comprising:

first detection of at least one critical dimension of the mask at the measurement points, wherein the first detection takes place sequentially and the duration of the first detection defines a measurement time period;

determining a plurality of reference measurement points from the plurality of measurement points, wherein the number of reference measurement points is less than the number of measurement points;

second detection of the at least one critical dimension of the mask at the reference measurement points in each case at a temporal distance from the first detection at the measurement points determined as reference measurement points;

determining a deviation between the first and the second detected critical dimension at each of the reference measurement points;

determining, depending on the determined deviation, a temporal profile of a correction factor over the measurement time period; and applying the determined temporal profile of the correction factor to the at least one critical dimension in order to obtain a corrected critical dimension of the mask.

Firstly some terms used in connection with the invention will be explained below:

A "critical dimension" denotes dimensions of critical features of the structure of the mask, such as, for example, a minimum line width of individual lines, a minimum line width of lines that are close together, and a minimum size of circular areas. The uniformity of the critical dimensions has a great effect on the imaging quality of the lithography process and thus on the quality of the structures transferred to the lithography object. The critical dimensions can be detected by use of interferometric methods, for example. A critical dimension can be represented for example as a value with the unit [nm].

A "measurement point" should be understood to mean such a region of the mask on which the at least one critical dimension to be detected is ascertainable. If a minimum line width of an individual line is intended to be detected, for example, the measurement point can have at least an extent such that it covers the entire line width. Accordingly, the measurement point for detecting a minimum line width of lines that are close together can additionally also cover an intermediate region between two lines.

In particular, the "detection of at least one critical dimension" can also comprise the detection of a plurality of critical dimensions. The critical dimensions to be detected in each case can be dependent on the constitution and suitability of the predefined measurement points, for example. For example, the measurement points can be predefined such that all critical dimensions of the mask that are required for the qualification of the mask are detectable.

The method according to the invention is for example part of a registration method for a mask for an EUV lithography system.

The invention involves an advantageous method for qualifying a mask of a lithography system which takes account of a temporal profile of a correction factor for at least one critical dimension of the mask in order to obtain a corrected critical dimension. In order to determine the correction factor, the critical dimension considered in each case is detected in each case sequentially a first time at all the measurement points of the mask and then a second time only at selected reference measurement points that constitute a subset of the measurement points. On the basis of the critical dimensions thus detected, for the reference measurement points a deviation between the first and the second detected critical dimension can be determined and the temporal profile of the correction factor over the measurement time period of the first detection can be ascertained therefrom, which can then be applied to the critical dimension considered in each case. By virtue of the fact that, in the method according to the invention, only some of the measurement points have to be taken into account in the further detection process required for determining the deviation, the time duration required for the second detection can be considerably shortened. As a result, the time required overall for the qualification method can be considerably reduced.

In one embodiment, determining the plurality of reference measurement points is dependent on a temporal distribution of measurement times of the measurement points within the measurement time period. Preferably, the measurement times of the measurement points to be determined as reference measurement points are at an identical temporal distance from one another, such that they are uniformly distributed temporally within the measurement time period. This enables the deviation between the first and the second detected critical dimension to be determined in a manner distributed uniformly over the plurality of the measurement points and thus enables the temporal profile of the correction factor to be determined particularly precisely.

Preferably, determining the temporal profile of the correction factor comprises determining a reference curve through the deviations respectively determined for the reference measurement points. In this way, for the measurement points not determined as reference measurement points, too, a deviation of the critical dimension considered can be estimated sufficiently precisely, which enables the temporal profile of the correction factor to be determined with a higher accuracy.

By way of example, the method furthermore comprises a third detection of the at least one critical dimension of the mask at at least one portion of the reference measurement points at a temporal distance from the second detection, wherein determining the deviation is additionally dependent on the additionally detected critical dimensions. By way of example, an average value is formed from the values of the respectively detected critical dimension that have been ascertained during the second detection and the third detection, and the deviation is determined between the first detected critical dimension and the average value of the second and third detected critical dimensions. By way of the third detection and taking account of the third detected critical dimensions when determining the deviation, the temporal profile of the correction factor can be determined even more precisely.

Advantageously, the mask has at least 500 measurement points, preferably at least 700 measurement points. Alternatively or additionally, the plurality of reference measurement points comprise a maximum of 10%, preferably a maximum of 5%, of the measurement points. With these numbers of measurement points and reference measurement points, the method constitutes a particularly efficient possibility for qualifying a mask of a lithography system with a sufficient precision.

In particular, the first detection, the second detection and/or the third detection can comprise in each case multiple detection of the at least one critical dimension. The critical dimension to be detected in each case can be obtained here by way of averaging over the critical dimensions multiply detected in each case.

In accordance with one embodiment, the method furthermore comprises outputting a signal if the deviation determined at a reference measurement point lies above a predefined threshold value. By way of example, a threshold value for a still permissible deviation is predefined for a critical dimension, preferably in each case for all detectable critical dimensions. If determining the deviation of the critical dimension considered in each case, for one reference measurement point or for a minimum number of reference measurement points, yields a value above the predefined threshold value, then a signal can be output at a suitable user interface. The signal can be an acoustic signal, for example a warning tone, or a visual signal, for example a message on a display. A possible malfunction of a device—used to carry out the method for qualifying a mask of a lithography system, such as, for example, an erroneous setting of the ambient conditions while the method is carried out or an erroneous setting of an image capture unit of the device, can be signaled in this way.

The invention furthermore discloses a device for qualifying a mask for a lithography system, wherein the mask has a plurality of predefined measurement points for detecting one or more critical dimensions of the mask at each measurement point, comprising a mask holder, an image capture unit, a processing unit and an evaluation unit, wherein the evaluation unit is configured to carry out the method according to the invention by use of the mask holder, the image capture unit and the processing unit.

The device according to the invention is for example a correspondingly configured mask metrology device for registering a mask for an EUV lithography system.

For a more detailed explanation of further advantageous developments of the device, reference is made to the developments of the method described above. The method can likewise be developed with further features described in connection with the device.

The embodiments and configurations described above should be understood to be merely by way of example and are not intended to restrict the present invention in any way.

BRIEF DESCRIPTION OF DRAWINGS

The invention is explained in greater detail by way of example below on the basis of advantageous embodiments with reference to the accompanying drawings. In the figures:

FIG. 6 shows a schematic illustration of a device according to the invention in accordance with one exemplary embodiment.

DETAILED DESCRIPTION

Figure 1:
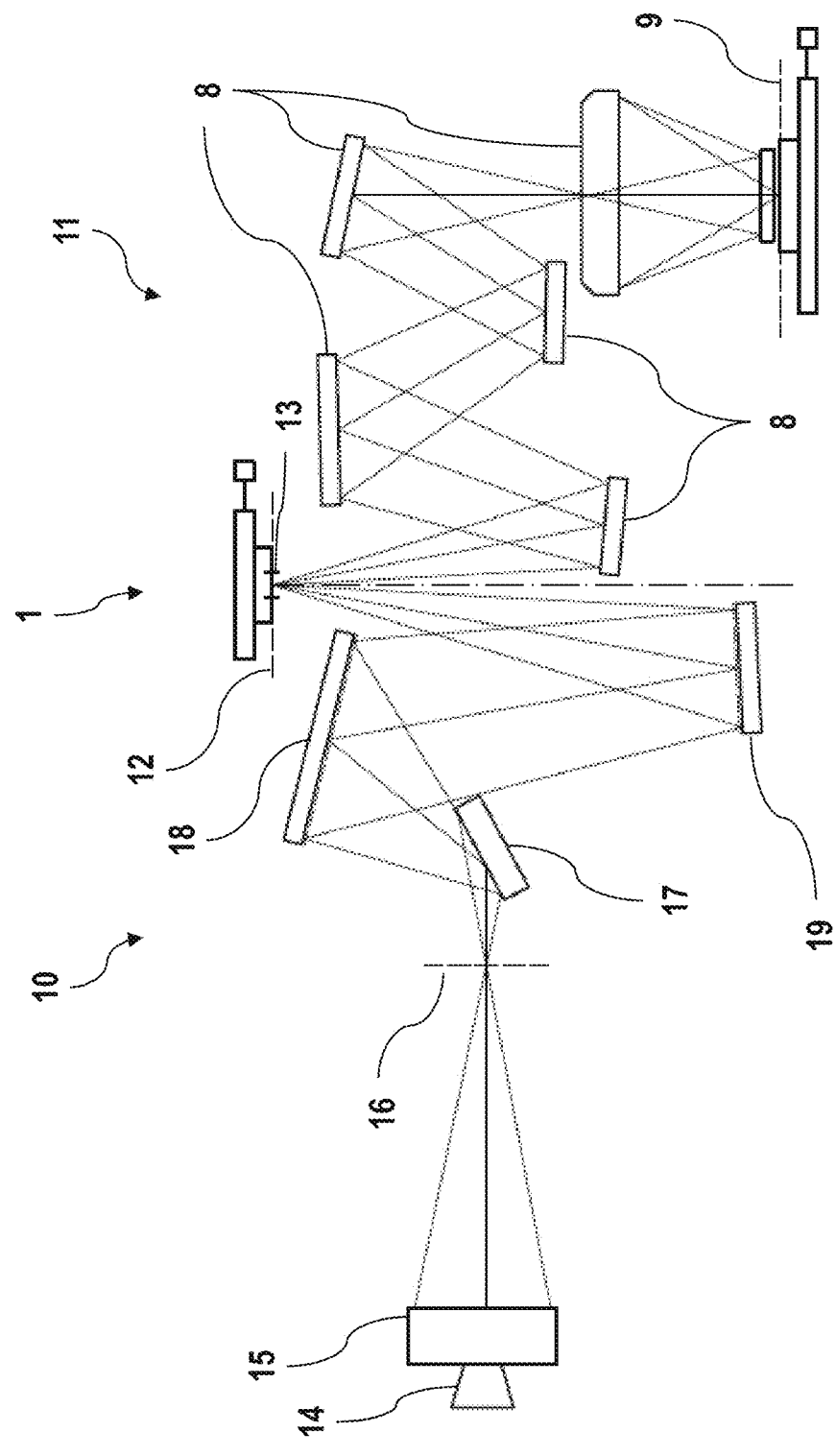
FIG. 1 shows a schematic illustration of one exemplary embodiment of a lithography system.

FIG. 1 schematically illustrates an EUV lithography system 1 as one exemplary embodiment of a lithography system. The EUV lithography system 1 comprises an illumination device 10 and a projection device 11. A mask 13 arranged in an object plane 12 in the object field is illuminated with the aid of the illumination device 10.

The illumination device 10 comprises an illumination radiation source 14, which emits electromagnetic radiation in the EUV range, i.e. in particular with a wavelength of between 5 nm and 100 nm. The illumination radiation emanating from the illumination radiation source 14 is firstly focused into an intermediate focal plane 16 by a collector 15.

The illumination device 10 comprises a deflection mirror 17, by which the illumination radiation emitted by the illumination radiation source 14 is deflected onto a first facet mirror 18. A second facet mirror 19 is disposed downstream of the first facet mirror 18. The first facet mirror 18 and the second facet mirror 19 each comprise a multiplicity of micromirrors that are individually pivotable about in each case two axes extending perpendicular to one another. The individual facets of the first facet mirror 18 are imaged into the mask 13 with the aid of the second facet mirror 19.

With the aid of the projection device 11, the mask 13 is imaged via a plurality of mirrors 8 onto a light-sensitive layer of a wafer arranged in an image plane 9. The various mirrors of the EUV lithography system 1 at which the illumination radiation is reflected are embodied as EUV mirrors. The EUV mirrors are provided with highly reflective coatings, for example in the form of multi layer coatings, in particular having alternating layers of molybdenum and silicon. The method according to the invention relates to the qualification of such a mask 13 in order to ascertain whether the quality of the mask 13 is sufficient for use in the lithography system 1.

Figure 2:
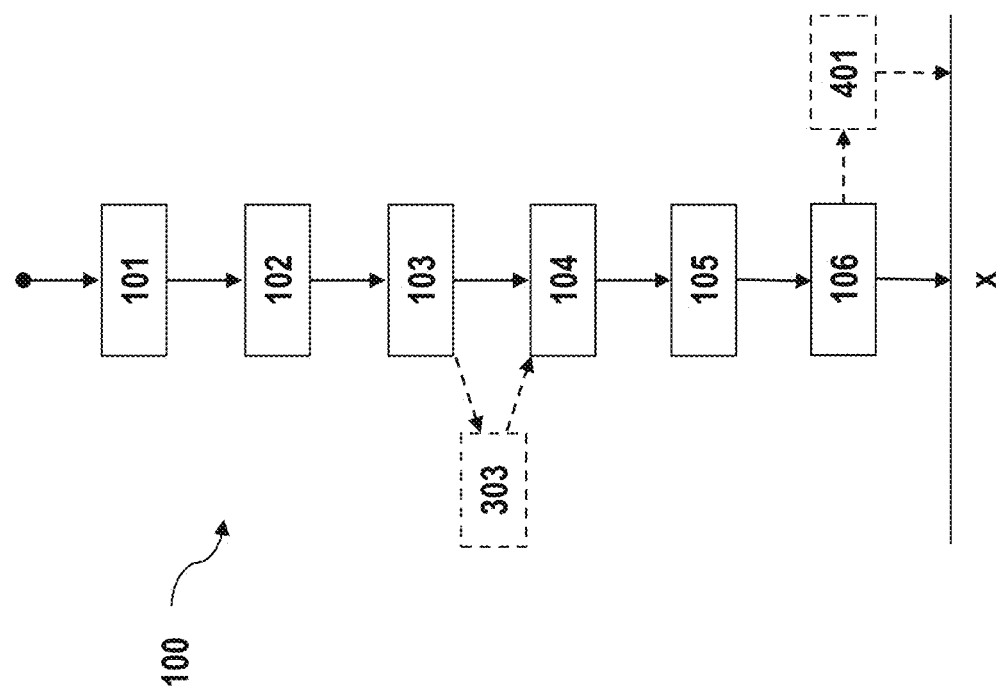
FIG. 2 shows a schematic flow diagram of a method according to the invention in accordance with one exemplary embodiment.

FIG. 2 shows a schematic flow diagram of one exemplary embodiment of a method 100 according to the invention for qualifying a mask 13 for a lithography system 1. The mask 13 has a plurality of predefined measurement points 22 for detecting one or more critical dimensions 20 at each measurement point 22 of the mask 13.

A step 101 involves carrying out a first detection of at least one critical dimension 20 of the mask 13 at the measurement points 22. This is done sequentially by use of interferometric methods. The duration of the first detection 101 defines a measurement time period.

Figure 3:
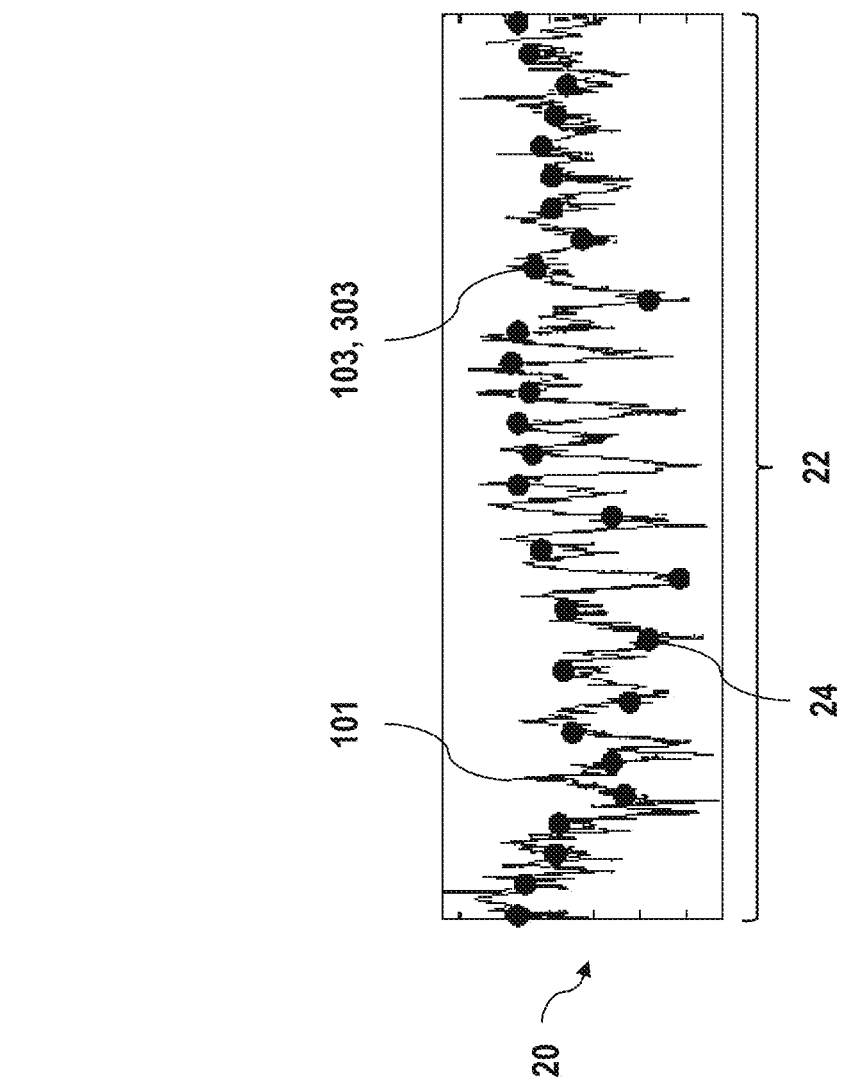
FIG. 3 shows an illustration of critical dimensions detected in each case at a plurality of measurement points and reference measurement points in accordance with one exemplary embodiment.

In FIG. 3, the critical dimensions 20 detected in each case for the measurement points 22 in step 101 are plotted with values between 47.6 nm and 48.4 nm. The number of measurement points 22 is 786. The duration of the first detection 101 is 7 h.

In step 102, a plurality of reference measurement points 24 are determined from the plurality of measurement points 22. In this case, the number of reference measurement points 24 is less than the number of measurement points 22 and is 30 in the present example and is thus less than 5% of the number of measurement points 22. The reference measurement points 24 determined from the plurality of measurement points 22 are likewise indicated in FIG. 3.

In the present example, the determining 102 is dependent on a temporal distribution of measurement times of the measurement points 22 within the measurement time period. In this way, reference measurement points 24 can be determined from the measurement points 22 by taking account of their respective measurement time within the duration of the first detection 101. In the example explained, the reference measurement points 24 have been determined such that the measurement times of the measurement points 22 to be determined as reference measurement points 24 are at an identical temporal distance from one another and are thus uniformly distributed temporally within the measurement time period.

At the reference measurement points 24, a second detection 103 of the at least one critical dimension 20 of the mask 13 takes place in each case at a temporal distance from the first detection 101 at the measurement points 22 determined as reference measurement points 24. The values of these second detected critical dimensions 20 are also plotted for the individual reference measurement points 24 in FIG. 3. The duration of the second detection 103 is 20 min and is thus considerably shorter than that of the first detection 101.

Step 104 involves determining a deviation 21 between the first and the second detected critical dimension 20 at each of the reference measurement points 24. For this purpose, for each measurement point 22 determined as reference measurement point 24, a deviation 21 of the value of the second detected critical dimension 20 from the value of the critical dimension 20 detected previously there in step 101 is determined. In the example illustrated, the deviation 21 is determined by subtracting the value of the first critical dimension 20 detected at the measurement point 22 determined as reference measurement point 24 from the value of the second critical dimension 20 detected at this reference measurement point 24.

Figure 4:
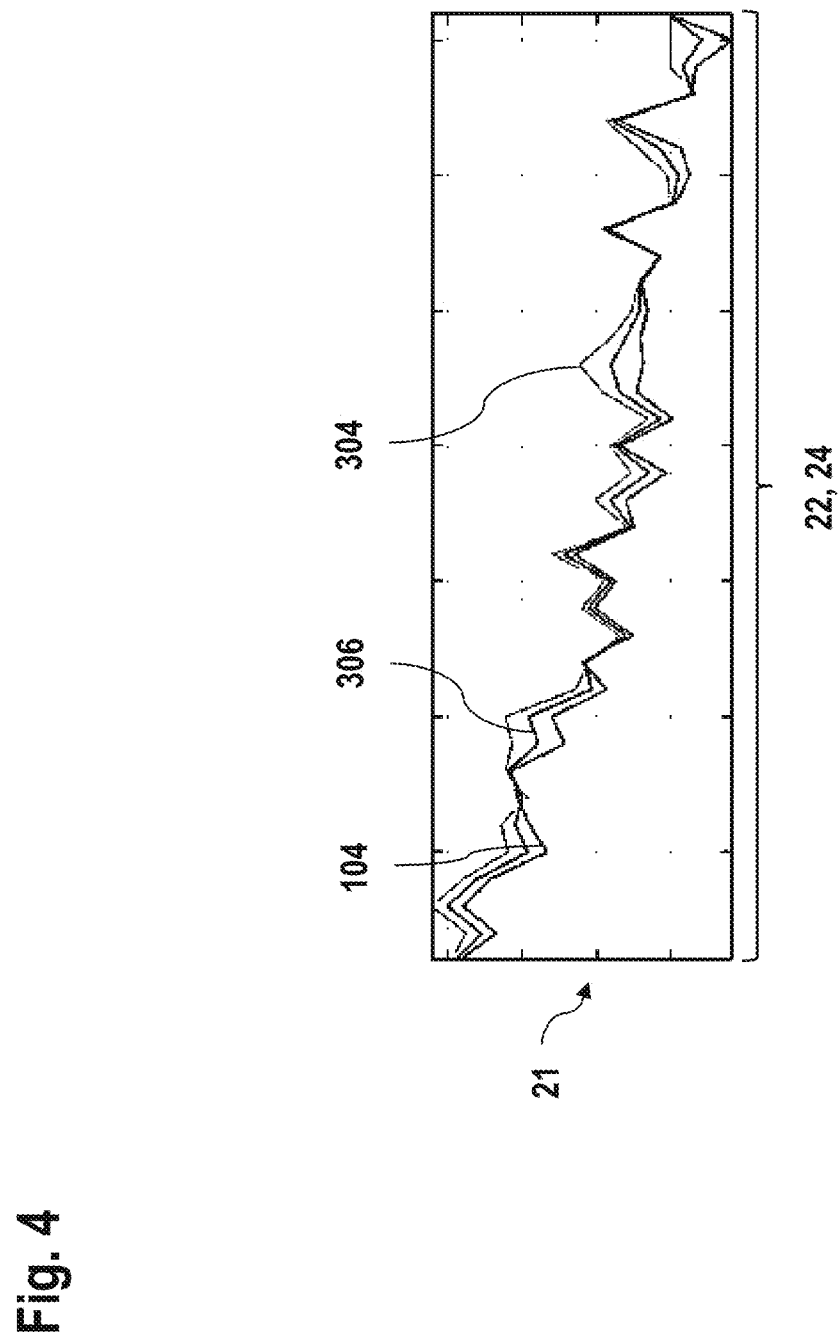
FIG. 4 shows an illustration of deviations of a critical dimension determined for a plurality of reference measurement points in accordance with one exemplary embodiment.

The deviations 21 thus determined between the first and the second detected critical dimension 20 are shown in FIG. 4, in which the value of the deviation 21—determined in step 104—between the first and the second detected critical dimension 20 is in each case plotted for the reference measurement points 24 (from the plurality of the measurement points 22). In the present example, the deviations 21 illustrated assume values from a range of between −0.03 nm and 0.15 nm.

Step 105 involves determining a temporal profile of a correction factor over the measurement time period depending on the deviation 21—determined in step 104—between the first and the second detected critical dimension 20.

In the example presented, determining 105 the temporal profile of the correction factor comprises determining a reference curve through the deviations 21—determined for the reference measurement points 24—of the critical dimension 20 considered in each case. For determining the reference curve, provision can be made of curve fitting over the deviation 21 determined for the reference measurement points 24 in step 104 by use of an nth degree polynomial.

Since the first detection 101 at the measurement points 22 has been carried out sequentially in a measurement time period defined by the duration of the first detection 101, 7 h in the present example, a temporal profile of the deviations 21 can be ascertained from the profile of the deviations 21 determined at the reference measurement points 24. On the basis of the change in the determined deviations 21 in this temporal profile, it is then possible to determine the temporal profile of the correction factor.

In the example explained, the determined temporal profile of the correction factor is applied to the at least one critical dimension 20 in step 106 in such a way that the correction factor for the considered critical dimension 20 of the mask 13 and its temporal profile are taken into account in a method for the registration of the mask 13 for use in the lithography system 1. A registration of the mask 13 can then take place depending on a critical dimension of the mask 13 that has been corrected in this way.

Moreover, the method 100 can furthermore comprise a third detection of the at least one critical dimension 20 of the mask 13 at the reference measurement points 24 or at at least some of the reference measurement points 24 as a further step 303, which takes place at a temporal distance from the second detection 103. Determining 104 the deviation 21 of the at least one critical dimension 20 can then take place additionally in a manner dependent on the at least one critical dimension 20 additionally detected in step 303.

Analogously to the critical dimensions detected in step 103, also for the critical dimensions additionally detected in step 303 at each measurement point 22 determined as reference measurement point 24, it is possible to determine a deviation 21 between the first critical dimension 20 detected (step 101) at this measurement point 22 and the third detected (step 303) critical dimension 20. These additionally determined deviations 21 are likewise depicted in FIG. 4 as a profile 304 over the reference measurement points 24.

Taking account of the deviations 21 of the at least one critical dimension 20 that are respectively determined at each of the reference measurement points 24, averaging can be carried out and an averaged deviation 21 of the critical dimension 20 considered in each case can be determined for each of the reference measurement points 24. A profile 306 of such an averaged deviation 21 over the reference measurement points 24 is also illustrated in FIG. 4. Accordingly, determining 105 the temporal profile of the correction factor can be carried out depending on the averaged deviation 21 determined in this way.

The method 100 furthermore provides for outputting 401 a signal if the deviation 21 determined for a reference measurement point 24 lies above a predefined threshold value. In this case, depending on an available user interface, a warning tone is output and/or a corresponding warning message is displayed.

Figure 5:
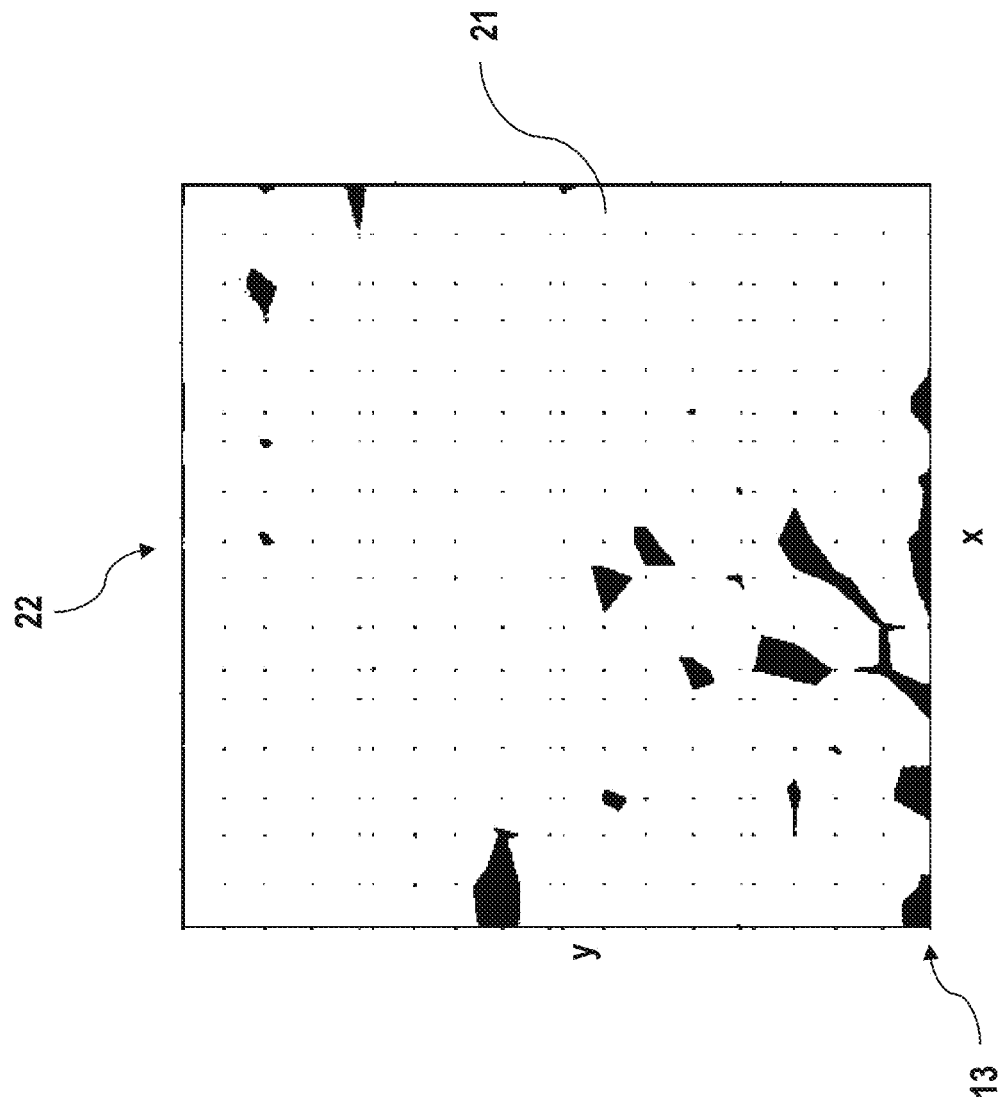
FIG. 5 shows an illustration of a spatial distribution of deviations of a critical dimension determined in accordance with one exemplary embodiment.

FIG. 5 shows an illustration of a deviation 21—determined in accordance with one exemplary embodiment—between the first and the second detected critical dimension 20 above a predefined threshold value in a spatial distribution over the area of a mask 13 which extends 140 mm in each case in the x-direction and in the y-direction. The x-axis and the y-axis indicate the respective coordinates of a measurement point 22 and of a reference measurement point 24 on the area of the mask 13. In the regions highlighted in black, the deviation 21 determined in each case lies above the threshold value.

The first detection 101 of the critical dimensions 20 at the measurement points 22 took place line by line, proceeding from the bottom left up to the top right. In the region of the mask 13 at the bottom left, larger regions of reference measurement points 24 are present in the case of which the determined deviation 21 lies above the threshold value, compared with in the further regions of the area of the mask 13. It can be deduced that the deviation 21 is larger at the beginning of the detection 101 than toward the end of the detection 101, which is reflected by a reduction of the deviation 21 in the temporal profile. Accordingly, the correction factor and its temporal profile, in step 105, are also determined and applied to the considered critical dimension 20 in such a way that its influence decreases as the duration of the lithography process increases.

FIG. 6 shows a device 30 for qualifying a mask 13 for a lithography system 1, wherein the mask 13 has a plurality of predefined measurement points 22 for detecting one or more critical dimensions 20 of the mask 13 at each measurement point 22. The device 30 comprises a mask holder 32, a processing unit 34, an image capture unit 36 and an evaluation unit 38, wherein the evaluation unit 38 is operatively connected to the mask holder 32, to the processing unit 34 and to the image capture unit 36. The evaluation unit 38 is configured to carry out the method 100 described above by use of the mask holder 32, the image capture unit 36 and the processing unit 34.

In this case, the mask holder 32 is controlled such that the image capture unit 36 can carry out a first detection 101 of at least one critical dimension 20 of a mask 13 held by the mask holder 32 at the measurement points 22. Afterward, the image capture unit 36 carries out such a first detection 101, wherein the first detection 101 takes place sequentially and the duration of the first detection 101 defines a measurement time period.

Furthermore, the processing unit 34 determines a plurality of reference measurement points 24 from the plurality of measurement points 22 (step 102), wherein the number of reference measurement points 24 is less than the number of measurement points 22.

The image capture unit 36 thereupon carries out a second detection 103 of the at least one critical dimension 20 of the mask 13 at the reference measurement points 24 in each case at a temporal distance from the first detection 101 at the measurement points 22 determined as reference measurement points 24, for which purpose the mask 13 is positioned accordingly by the mask holder 32.

The processing unit 34 determines a deviation 21 between the first and the second detected critical dimension 20 at each of the reference measurement points 24 (step 104) and, depending on the determined deviation 21, a temporal profile of a correction factor over the measurement time period (step 105). Afterward, the evaluation unit 38 effects a step of applying 106 the determined temporal profile of the correction factor to the at least one critical dimension 20 in order to obtain a corrected critical dimension of the mask 13 by use of the processing unit 34.

For example, the image capture unit 36 can include a charge-coupled device (CCD) sensor or a complementary metal-oxide semiconductor (CMOS) sensor. In some implementations, each of the processing unit 34 and the evaluation unit 38 can include one or more computers that include one or more one or more data processors configured to execute one or more programs that include a plurality of instructions according to the principles described above.

The one or more computers can include one or more data processors for processing data, one or more storage devices for storing data, and/or one or more computer programs including instructions that when executed by the one or more computers cause the one or more computers to carry out the processes. The one or more computers can include one or more input devices, such as a keyboard, a mouse, a touchpad, and/or a voice command input module, and one or more output devices, such as a display, and/or an audio speaker. In some implementations, the one or more computing devices can include digital electronic circuitry, computer hardware, firmware, software, or any combination of the above. The features related to processing of data can be implemented in a computer program product tangibly embodied in an information carrier, e.g., in a machine-readable storage device, for execution by a programmable processor; and method steps can be performed by a programmable processor executing a program of instructions to perform functions of the described implementations. Alternatively or in addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

A computer program can be written in any form of programming language, including compiled or interpreted languages, and it can be deployed in any form, including as a stand-alone program or as a module, component, subroutine, or other unit suitable for use in a computing environment.

For example, the one or more computers can be configured to be suitable for the execution of a computer program and can include, by way of example, both general and special purpose microprocessors, and any one or more processors of any kind of digital computer. Generally, a processor will receive instructions and data from a read-only storage area or a random access storage area or both. Elements of a computer system include one or more processors for executing instructions and one or more storage area devices for storing instructions and data. Generally, a computer system will also include, or be operatively coupled to receive data from, or transfer data to, or both, one or more machine-readable storage media, such as hard drives, magnetic disks, solid state drives, magneto-optical disks, or optical disks. Machine-readable storage media suitable for embodying computer program instructions and data include various forms of non-volatile storage area, including by way of example, semiconductor storage devices, e.g., EPROM, EEPROM, flash storage devices, and solid state drives; magnetic disks, e.g., internal hard disks or removable disks; magneto-optical disks; and CD-ROM, DVD-ROM, and/or Blu-ray discs.

In some implementations, the processes described above can be implemented using software for execution on one or more mobile computing devices, one or more local computing devices, and/or one or more remote computing devices (which can be, e.g., cloud computing devices). For instance, the software forms procedures in one or more computer programs that execute on one or more programmed or programmable computer systems, either in the mobile computing devices, local computing devices, or remote computing systems (which may be of various architectures such as distributed, client/server, grid, or cloud), each including at least one processor, at least one data storage system (including volatile and non-volatile memory and/or storage elements), at least one wired or wireless input device or port, and at least one wired or wireless output device or port.

In some implementations, the software may be provided on a medium, such as CD-ROM, DVD-ROM, Blu-ray disc, a solid state drive, or a hard drive, readable by a general or special purpose programmable computer or delivered (encoded in a propagated signal) over a network to the computer where it is executed. The functions can be performed on a special purpose computer, or using special-purpose hardware, such as coprocessors. The software can be implemented in a distributed manner in which different parts of the computation specified by the software are performed by different computers. Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system can also be considered to be implemented as a computer-readable storage medium, configured with a computer program, where the storage medium so configured causes a computer system to operate in a specific and predefined manner to perform the functions described herein.

The embodiments of the present invention that are described in this specification and the optional features and properties respectively mentioned in this regard should also be understood to be disclosed in all combinations with one another. In particular, in the present case, the description of a feature comprised by an embodiment—unless explicitly explained to the contrary—should also not be understood such that the feature is essential or indispensable for the function of the embodiment.

What is claimed is:

1. A method for qualifying a mask for a lithography system, wherein the mask has a plurality of predefined measurement points for detecting one or more critical dimensions of the mask at each measurement point, comprising:
    first detection of at least one critical dimension of the mask at the measurement points, wherein the first detection takes place sequentially and the duration of the first detection defines a measurement time period;
    determining a plurality of reference measurement points from the plurality of measurement points, wherein the number of reference measurement points is less than the number of measurement points;
    second detection of the at least one critical dimension of the mask at the reference measurement points in each case at a temporal distance from the first detection at the measurement points determined as reference measurement points;
    determining a deviation between the first and the second detected critical dimension at each of the reference measurement points;
    determining, depending on the determined deviation, a temporal profile of a correction factor over the measurement time period; and
    applying the determined temporal profile of the correction factor to the at least one critical dimension in order to obtain a corrected critical dimension of the mask.

2. The method of claim 1, wherein determining the plurality of reference measurement points is dependent on a temporal distribution of measurement times of the measurement points within the measurement time period, wherein preferably the reference measurement points have measurement times which are uniformly distributed temporally within the measurement time period.

3. The method of claim 1, wherein determining the temporal profile of the correction factor comprises determining a reference curve through the deviations respectively determined for the reference measurement points.

4. The method of claim 1, furthermore comprising:
    third detection of the at least one critical dimension of the mask at at least one portion of the reference measurement points at a temporal distance from the second detection, wherein determining the deviation is additionally dependent on the third detected critical dimensions.

5. The method of claim 1, wherein the mask has at least 500 measurement points, preferably at least 700 measurement points.

6. The method of claim 1, wherein the plurality of reference measurement points comprise a maximum of 10%, preferably a maximum of 5%, of the measurement points.

7. The method of claim 1, wherein the first detection, the second detection and/or the third detection comprise(s) in each case multiple detection of the at least one critical dimension in order to form an average value.

8. The method of claim 1, wherein the measurement points are predefined such that all critical dimensions of the mask that are required for the qualification of the mask are detectable.

9. The method of claim 1, furthermore comprising:
    outputting a signal if the deviation determined at a reference measurement point lies above a predefined threshold value.

10. A device for qualifying a mask for a lithography system, wherein the mask has a plurality of predefined measurement points for detecting one or more critical dimensions of the mask at each measurement point, comprising a mask holder, an image capture unit, a processing unit and an evaluation unit, wherein the evaluation unit is configured to carry out the method of claim 1 by use of the mask holder, the image capture unit and the processing unit.

11. The device of claim 10, wherein determining the plurality of reference measurement points is dependent on a temporal distribution of measurement times of the measurement points within the measurement time period.

12. The device of claim 10, wherein determining the temporal profile of the correction factor comprises determining a reference curve through the deviations respectively determined for the reference measurement points.

13. The device of claim 10, wherein the evaluation unit is configured to carry out third detection of the at least one critical dimension of the mask at at least one portion of the reference measurement points at a temporal distance from the second detection,
   wherein determining the deviation is additionally dependent on the third detected critical dimensions.

14. The device of claim 10, wherein the mask has at least 500 measurement points.

15. The device of claim 10, wherein the plurality of reference measurement points comprise a maximum of 10% of the measurement points.

16. The device of claim 10, wherein at each of some of the measurement points, the first detection, the second detection and the third detection produce multiple detections of the at least one critical dimension, and wherein the evaluation unit is configured to determine an average value from the multiple detections.

17. The device of claim 10, wherein the measurement points are predefined such that all critical dimensions of the mask that are required for the qualification of the mask are detectable.

18. The device of claim 10, wherein the evaluation unit is configured to carry out outputting a signal if the deviation determined at a reference measurement point lies above a predefined threshold value.

19. The method of claim 2, wherein determining the temporal profile of the correction factor comprises determining a reference curve through the deviations respectively determined for the reference measurement points.

20. The method of claim 2, further comprising third detection of the at least one critical dimension of the mask at at least one portion of the reference measurement points at a temporal distance from the second detection, wherein determining the deviation is additionally dependent on the third detected critical dimensions.

\* \* \* \* \*

UNITED STATES PATENT AND TRADEMARK OFFICE
CERTIFICATE OF CORRECTION

Page 1 of 1

| | |
|---|---|
| PATENT NO. | : 12,353,126 B2 |
| APPLICATION NO. | : 18/373351 |
| DATED | : July 8, 2025 |
| INVENTOR(S) | : Asad Rasool, Carola Blaesing-Bangert and Steffen Weissenberg |

It is certified that error appears in the above-identified patent and that said Letters Patent is hereby corrected as shown below:

In the Specification

<u>Column 8</u>
Lines 33-34, delete "one or more one or more" and insert -- one or more --

Signed and Sealed this
Ninth Day of September, 2025

Coke Morgan Stewart
*Acting Director of the United States Patent and Trademark Office*